(12) United States Patent
Hao et al.

(10) Patent No.: US 12,520,665 B2
(45) Date of Patent: Jan. 6, 2026

(54) DISPLAY PANEL AND DISPLAY DEVICE

(71) Applicants: BEIJING BOE TECHNOLOGY DEVELOPMENT CO., LTD., Beijing (CN); BOE TECHNOLOGY GROUP CO., LTD., Beijing (CN)

(72) Inventors: Xueguang Hao, Beijing (CN); Yongda Ma, Beijing (CN); Hongfei Cheng, Beijing (CN)

(73) Assignee: BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 640 days.

(21) Appl. No.: 17/914,780

(22) PCT Filed: Nov. 3, 2021

(86) PCT No.: PCT/CN2021/128400
§ 371 (c)(1),
(2) Date: Sep. 27, 2022

(87) PCT Pub. No.: WO2022/166284
PCT Pub. Date: Aug. 11, 2022

(65) Prior Publication Data
US 2023/0138001 A1    May 4, 2023

(30) Foreign Application Priority Data

Feb. 3, 2021 (CN) .......................... 202120339751.1

(51) Int. Cl.
*H10K 59/121*        (2023.01)
*G09G 3/3233*        (2016.01)
(Continued)

(52) U.S. Cl.
CPC ....... *H10K 59/1213* (2023.02); *G09G 3/3233* (2013.01); *H10D 86/441* (2025.01);
(Continued)

(58) Field of Classification Search
CPC ............. H10K 59/1213; H10K 59/131; H10K 59/35; H10D 86/441; H10D 86/60;
(Continued)

(56) References Cited

U.S. PATENT DOCUMENTS 10,380,939 B2    8/2019  Minami
11,004,871 B2    5/2021  Yang et al.
(Continued)

FOREIGN PATENT DOCUMENTS

CN         1945850 A      4/2007
CN       106415702 A      2/2017
(Continued)

*Primary Examiner* — Anne M Hines
(74) *Attorney, Agent, or Firm* — Chiwin Law LLC

(57) ABSTRACT

A display panel and a display device are provided. The display panel includes a plurality of pixel units, each pixel unit includes a pixel circuit and a light-emitting element, the pixel circuit is configured to drive the light-emitting element, the pixel circuit includes a driving transistor, the plurality of pixel units include a first pixel unit and a second pixel unit, the first pixel unit is configured to emit light of a first color, the second pixel unit is configured to emit light of a second color, the driving transistor of the pixel circuit of the first pixel unit includes a first channel, and the driving transistor of the pixel circuit of the second pixel unit includes a second channel, a width-to-length ratio of the first channel is greater than that of the second channel, and a shape of the first channel is different from that of the second channel.

20 Claims, 10 Drawing Sheets

(51) Int. Cl.
*H10D 86/40* (2025.01)
*H10D 86/60* (2025.01)
*H10K 59/131* (2023.01)
*H10K 59/35* (2023.01)

(52) U.S. Cl.
CPC ..... *H10D 86/60* (2025.01); *G09G 2300/0426* (2013.01); *G09G 2300/0819* (2013.01); *G09G 2300/0842* (2013.01); *H10D 86/421* (2025.01); *H10K 59/131* (2023.02); *H10K 59/35* (2023.02)

(58) Field of Classification Search
CPC ............... H10D 86/421; G09G 3/3233; G09G 2300/0426; G09G 2300/0819; G09G 2300/0842
See application file for complete search history.

(56) References Cited

U.S. PATENT DOCUMENTS

2003/0179166 A1 9/2003 Li
2007/0007955 A1 1/2007 Goldfine et al.
2021/0193013 A1* 6/2021 Xu ...................... H10K 59/353

FOREIGN PATENT DOCUMENTS

| CN | 110060621 A | 7/2019 |
| CN | 210575036 U | 5/2020 |
| CN | 111799318 A | 10/2020 |
| CN | 112086467 A | 12/2020 |
| CN | 214477461 U | 10/2021 |
| KR | 20100046439 A | 5/2010 |

* cited by examiner

DISPLAY PANEL AND DISPLAY DEVICE

CROSS-REFERENCE TO RELATED APPLICATION

For all purposes, the present application is a U.S. National Phase Entry of International Application No. PCT/CN2021/128400 filed on Nov. 3, 2021, which claims priority to the Chinese patent application No. 202120339751.1 filed on Feb. 3, 2021, the disclosure of which is incorporated herein by reference in its entirety as part of the embodiment of the present disclosure.

TECHNICAL FIELD

At least one embodiment of the present disclosure relates to a display panel and a display device.

BACKGROUND

Generally, driving transistors in drive circuits of pixel units that emit light of different colors have a same width-to-length ratio of a channel.

SUMMARY

At least one embodiment of the present disclosure relates to a display panel and a display device.

At least one embodiment of the present disclosure provides a display panel including: a plurality of pixel units, each of the plurality of pixel units includes a pixel circuit and a light-emitting element, the pixel circuit is configured to drive the light-emitting element, the pixel circuit includes a driving transistor, the plurality of pixel units include a first pixel unit and a second pixel unit, the first pixel unit is configured to emit light of a first color, the second pixel unit is configured to emit light of a second color, the driving transistor of the pixel circuit of the first pixel unit includes a first channel, and the driving transistor of the pixel circuit of the second pixel unit includes a second channel, a width-to-length ratio of the first channel is greater than a width-to-length ratio of the second channel, and a shape of the first channel is different from a shape of the second channel.

For example, a width of the first channel is the same as a width of the second channel, and a length of the first channel is less than a length of the second channel.

For example, the shape of the first channel includes a U-shape.

For example, the shape of the second channel includes a mirror image of S-shape, a serpentine shape, a square waveform, a zigzag shape, or a double U-shape.

For example, the shape of the second channel includes a double U-shape, and the double U-shape includes a first U-shaped portion and a second U-shaped portion, the first U-shaped portion and the second U-shaped portion share a same side, and opening directions of the first U-shaped portion and the second U-shaped portion are different.

For example, the second channel includes a first portion, a second portion, a third portion, a fourth portion, and a fifth portion that are connected in sequence, the first portion, the third portion, and the fifth portion all extend in a first direction X, both the second portion and the fourth portion extend in a second direction Y, the first direction X intersects with the second direction Y.

For example, the plurality of pixel units further includes a third pixel unit, the third pixel unit is configured to emit light of a third color, the driving transistor of the pixel circuit of the third pixel unit includes a third channel, and the width-to-length ratio of the first channel is different from a width-to-length ratio of the third channel.

For example, the width-to-length ratio of the first channel, the width-to-length ratio of the second channel, and the width-to-length ratio of the third channel are different from one another.

For example, the width-to-length ratio of the second channel is greater than or equal to the width-to-length ratio of the third channel.

For example, a shape of the third channel is the same as the shape of the second channel.

For example, the shape of the third channel includes a mirror image of S-shape, a serpentine shape, a square waveform, a zigzag shape, or a double U-shape.

For example, a width of the third channel is the same as a width of the second channel, and a length of the third channel is greater than or equal to a length of the second channel.

For example, the pixel circuit further includes a storage capacitor, a first transistor, a second transistor, a third transistor, and a fourth transistor, a first electrode plate of the storage capacitor is connected with a gate electrode of the driving transistor, a second electrode plate of the storage capacitor is connected with a first power supply line, and a first electrode of the driving transistor is connected with the first power supply line, a gate electrode of the first transistor is connected with a gate line, a first electrode of the first transistor is connected with the first electrode of the driving transistor, a second electrode of the first transistor is connected with a data line, a gate electrode of the second transistor is connected with the gate line, a first electrode of the second transistor is connected with a second electrode of the driving transistor, and a second electrode of the second transistor is connected with the gate electrode of the driving transistor, a gate electrode of the third transistor is connected with a light-emitting control signal line, a first electrode of the third transistor is connected with the second electrode of the driving transistor, and a second electrode of the third transistor is connected with a first electrode of the light-emitting element, a second electrode of the light-emitting element is connected with a second power supply line, a gate electrode of the fourth transistor is connected with a reset control signal line, a first electrode of the fourth transistor is connected with the gate electrode of the driving transistor, and a second electrode of the fourth transistor is connected with an initialization signal line.

For example, the display panel further includes a first connection electrode, a second connection electrode, and a third connection electrode, one end of the first connection electrode is connected with the first electrode of the light-emitting element, and the other end of the first connection electrode is connected with the second electrode of the third transistor; the second electrode plate of the storage capacitor has an opening, one end of the second connection electrode passes through the opening and is connected with the gate electrode of the driving transistor, and the other end of the second connection electrode is connected with the first electrode of the fourth transistor and the second electrode of the second transistor; one end of the third connection electrode is connected with the second electrode of the fourth transistor, and the other end of the third connection electrode is connected with the initialization signal line.

For example, the display panel further includes a base substrate, the pixel unit is located on the base substrate, and the driving transistor of the pixel circuit of the first pixel unit includes a first gate electrode, the driving transistor of the pixel circuit of the second pixel unit includes a second gate electrode, an orthographic projection of the first gate electrode on the base substrate partially overlaps with an orthographic projection of the first channel on the base substrate, an orthographic projection of the second gate electrode on the base substrate partially overlaps with an orthographic projection of the second channel on the base substrate.

For example, the display panel further includes a base substrate, the pixel unit is located on the base substrate, and the driving transistor of the pixel circuit of the third pixel unit includes a third electrode, an orthographic projection of the third gate electrode on the base substrate partially overlaps with an orthographic projection of the third channel on the base substrate.

For example, the first pixel unit includes a pixel unit emitting blue light, the second pixel unit includes a pixel unit emitting red light, and the third pixel unit includes a pixel unit emitting green light.

For example, the light-emitting element includes an organic light-emitting diode, and the display panel includes an organic light-emitting diode display panel.

At least one embodiment of the present disclosure provides a display device including any one of the display panels as described above.

BRIEF DESCRIPTION OF THE DRAWINGS

Hereinafter, the drawings accompanying embodiments of the present disclosure are simply introduced in order to more clearly explain technical solution(s) of the embodiments of the present disclosure. Obviously, the described drawings below are merely related to some of the embodiments of the present disclosure without constituting any limitation thereto.

DETAILED DESCRIPTION

In order to make objectives, technical details and advantages of the embodiments of the present disclosure more clear, the technical solutions of the embodiments of the present disclosure will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. The terms "on," "under," "right," "left" and the like are only used to indicate relative position relationship, and when the position of the described object is changed, the relative position relationship may be changed accordingly.

For an electroluminescent display device, a pixel unit includes a driving circuit and a light-emitting element, and the pixel circuit is configured to drive the light-emitting element. For example, the pixel circuit is configured to drive the light-emitting element to emit light. For example, the pixel circuit is configured to provide a drive current to drive the light-emitting element to emit light.

For example, the light-emitting element includes a first electrode, a second electrode, and a light-emitting layer between the first electrode and the second electrode. Because efficiencies and lifespans of the light-emitting layers in the pixel units emitting light of different colors are different, driving transistors with the same width-to-length ratio will lead to problems of poor display uniformity and short display lifespan.

Figure 1:
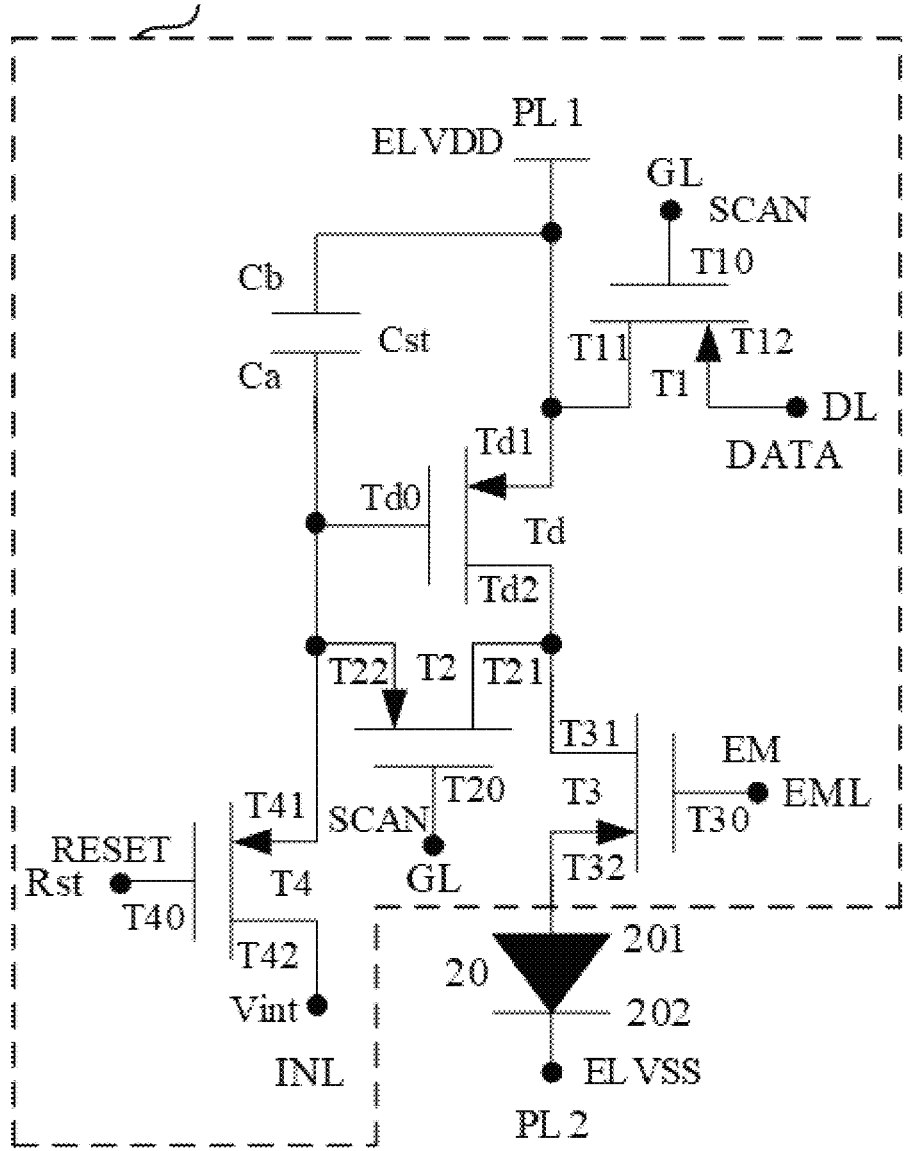
FIG. 1 is a diagram illustrating a principle of a pixel circuit of a display panel provided by an embodiment of the present disclosure.
Figure 2:
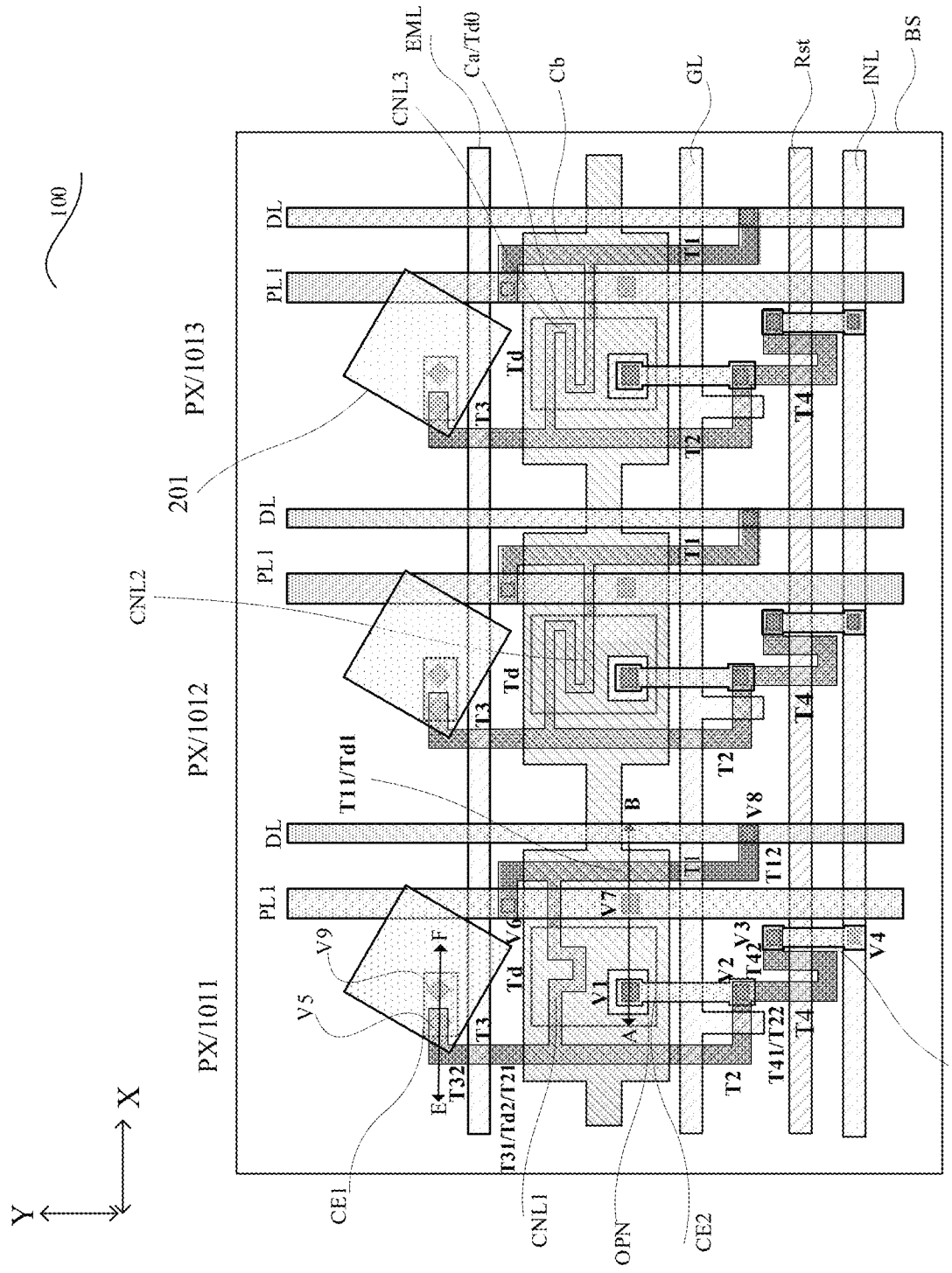
FIG. 2 is a pixel layout diagram of the display panel provided by an embodiment of the present disclosure.

FIG. 1 is a diagram illustrating a principle of a pixel circuit of a display panel provided by an embodiment of the present disclosure. FIG. 2 is a pixel layout diagram of the display panel provided by an embodiment of the present disclosure. Please refer to FIG. 1 and FIG. 2 together, a display panel 100 includes a plurality of pixel units 101. For example, the plurality of pixel units 101 are arranged in a matrix, but not limited thereto. For example, each pixel unit 101 of the plurality of pixel units 101 includes a pixel circuit 10 and a light-emitting element 20, and the pixel circuit 10 is configured to drive the light-emitting element 20. For example, each pixel unit 101 includes a pixel circuit 10, a light-emitting element 20, a gate line GL, a data line DL, and a voltage signal line (including at least one of a first power supply line PL1, a second power supply line PL2, a light-emitting control signal line EML, an initialization signal line INL, and a reset control signal line Rst etc. mentioned later)

For example, the light-emitting element 20 is an organic light-emitting diode (OLED) or a quantum dot light-emitting diode (QLED), and the light-emitting element 20 emits red light, green light, blue light, or white light, etc. under a driving of a corresponding pixel circuit 10. The voltage signal line may include one voltage signal line or a plurality of voltage signal lines. For example, as illustrated in FIG. 1, the voltage signal line includes at least one of the first power supply line PL1, the second power supply line PL2, the light-emitting control signal line EML, the initialization signal line INL and the reset control signal line Rst etc. The gate line GL is configured to supply a scan signal SCAN to the pixel circuit 10. The data line DL is configured to supply a data signal DATA to the pixel circuit 10. For example, one pixel PX includes a plurality of pixel units 101. A pixel may include a plurality of pixel units that emit light of different colors. For example, one pixel includes a pixel unit emitting red light, a pixel unit emitting green light, and a pixel unit emitting blue light, but is not limited thereto. The number of pixel units included in a pixel and a light-emitting color of each pixel unit can be determined as required.

For example, the first power supply line PL1 is configured to supply a first voltage signal ELVDD that is constant to the pixel circuit 10, the second power supply line PL2 is configured to supply a second voltage signal ELVSS that is constant to the pixel circuit 10, and the first voltage signal ELVDD is greater than the second voltage signal ELVSS. The light-emitting control signal line EML is configured to supply a light-emitting control signal EM to the pixel circuit 10. The initialization signal line INL is configured to supply an initialization signal Vint to the pixel circuit 10, and the reset control signal line Rst is configured to supply a reset control signal RESET to the pixel circuit 10. For example, the initialization signal Vint is a constant voltage signal, and its magnitude may be between the first voltage signal ELVDD and the second voltage signal ELVSS, but not limited to this. For example, the initialization signal Vint may be less than or equal to the second voltage signal ELVSS.

As illustrated in FIG. 1 and FIG. 2, the pixel circuit 10 includes a driving transistor Td, a first transistor T1, a second transistor T2, a third transistor T3, a fourth transistor T4, and a storage capacitor Cst. As illustrated in FIG. 1 and FIG. 2, the driving transistor Td is electrically connected with the light-emitting element 20 and outputs a driving current under a control of the scan signal SCAN, the data signal DATA, the first voltage signal ELVDD, the second voltage signal ELVSS and other signals to drive the light-emitting element 20 to emit light. For example, the first transistor T1 is a data writing transistor, the second transistor T2 is a threshold compensation transistor, the third transistor T3 is a light-emitting control transistor, and the fourth transistor T4 is a reset transistor.

For example, as illustrated in FIG. 1, a first electrode plate Ca of the storage capacitor Cst is connected with a gate electrode Td0 of the driving transistor Td, a second electrode plate Cb of the storage capacitor Cst is connected with the first power supply line PL1, and a first electrode Td1 of the driving transistor Td is connected with the first power supply line PL1.

For example, as illustrated in FIG. 1, a gate electrode T10 of the first transistor T1 is connected with the gate line GL, a first electrode T11 of the first transistor T1 is connected with the first electrode Td1 of the driving transistor Td, and a second electrode T12 the first transistor T1 is connected with the data line DL.

For example, as illustrated in FIG. 1, a gate electrode T20 of the second transistor T2 is connected with the gate line GL, a first electrode T21 of the second transistor T2 is connected with the second electrode Td2 of the driving transistor Td, a second electrode T22 of the second transistor T2 is connected with the gate electrode Td0 of the driving transistor Td.

For example, as illustrated in FIG. 1, a gate electrode T30 of the third transistor T3 is connected with the light-emitting control signal line EML, a first electrode T31 of the third transistor T3 is connected with the second electrode Td2 of the driving transistor Td, and a second electrode T32 of the third transistor T3 is connected with a first electrode 201 of the light-emitting element 20.

For example, as illustrated in FIG. 1, a second electrode 202 of the light-emitting element 20 is connected with the second power supply line PL2.

For example, as illustrated in FIG. 1, a gate electrode T40 of the fourth transistor T4 is connected with the reset control signal line Rst, a first electrode T41 of the fourth transistor T4 is connected with a gate electrode Td0 of the driving transistor Td, and a second electrode T42 of the fourth transistor T4 is connected with the initialization signal line INL.

For example, the first electrode 201 of the light-emitting element 20 is an anode, and the second electrode 202 of the light-emitting element 20 is a cathode, but not limited thereto.

It should be noted that, the transistors used in an embodiment of the present disclosure may all be thin film transistors or field effect transistors, or other switching components with the same characteristics. A source electrode and a drain electrode of the transistor used here may be symmetrical in structure, so the source electrode and the drain electrode of the transistor may be indistinguishable in structure. In an embodiment of the present disclosure, in order to distinguish two electrodes of the transistor except the gate electrode, it is directly described that one electrode is the first electrode and the other electrode is the second electrode, so the first electrode and the second electrode of all or part of the transistors of the embodiment of the present disclosure are interchangeable as required. For example, the first electrode of the transistor described in the embodiments of the present disclosure may be the source electrode, and the second electrode may be the drain electrode; or, the first electrode of the transistor may be the drain electrode, and the second electrode may be the source electrode.

In addition, transistors can be classified into N-type transistor and P-type transistor according to characteristics. The embodiments of the present disclosure are described with reference to the case where the transistors all adopt P-type transistors by way of example. Based on descriptions and teachings of the present disclosure, those of ordinary skill in the art can easily think of using N-type transistors for at least part of the transistors in the pixel circuit structure of the embodiments of the present disclosure without any creative work, that is, an implementation manner of using the N-type transistor or a combination of the N-type transistor and the P-type transistor. Therefore, these implementations are also within a protection scope of the present disclosure.

For example, as illustrated in FIG. 2, the display panel includes: a plurality of pixel units 101. FIG. 2 illustrates three pixel units 101. The number of pixel units 101 included in the display panel is not limited to that illustrated in the figure, and can be set as required. For example, as illustrated in FIG. 2, the plurality of pixel units 101 include a first pixel unit 1011, a second pixel unit 1012, and a third pixel unit 1013.

For example, the first pixel unit 1011 is configured to emit light of a first color, the second pixel unit 1012 is configured to emit light of a second color, and the third pixel unit 1013 is configured to emit light of a third color. For example, the first pixel unit 1011 includes the pixel unit 101 that emits blue light, the second pixel unit 1012 includes the pixel unit 101 that emits red light, and the third pixel unit 1013 includes the pixel unit 101 that emits green light, the embodiments of the present disclosure are described by taking this as an example. For example, as illustrated in FIG. 2, the pixel PX includes a first pixel unit 1011, a second pixel unit 1012, and a third pixel unit 1013, but is not limited thereto.

Figure 3A:
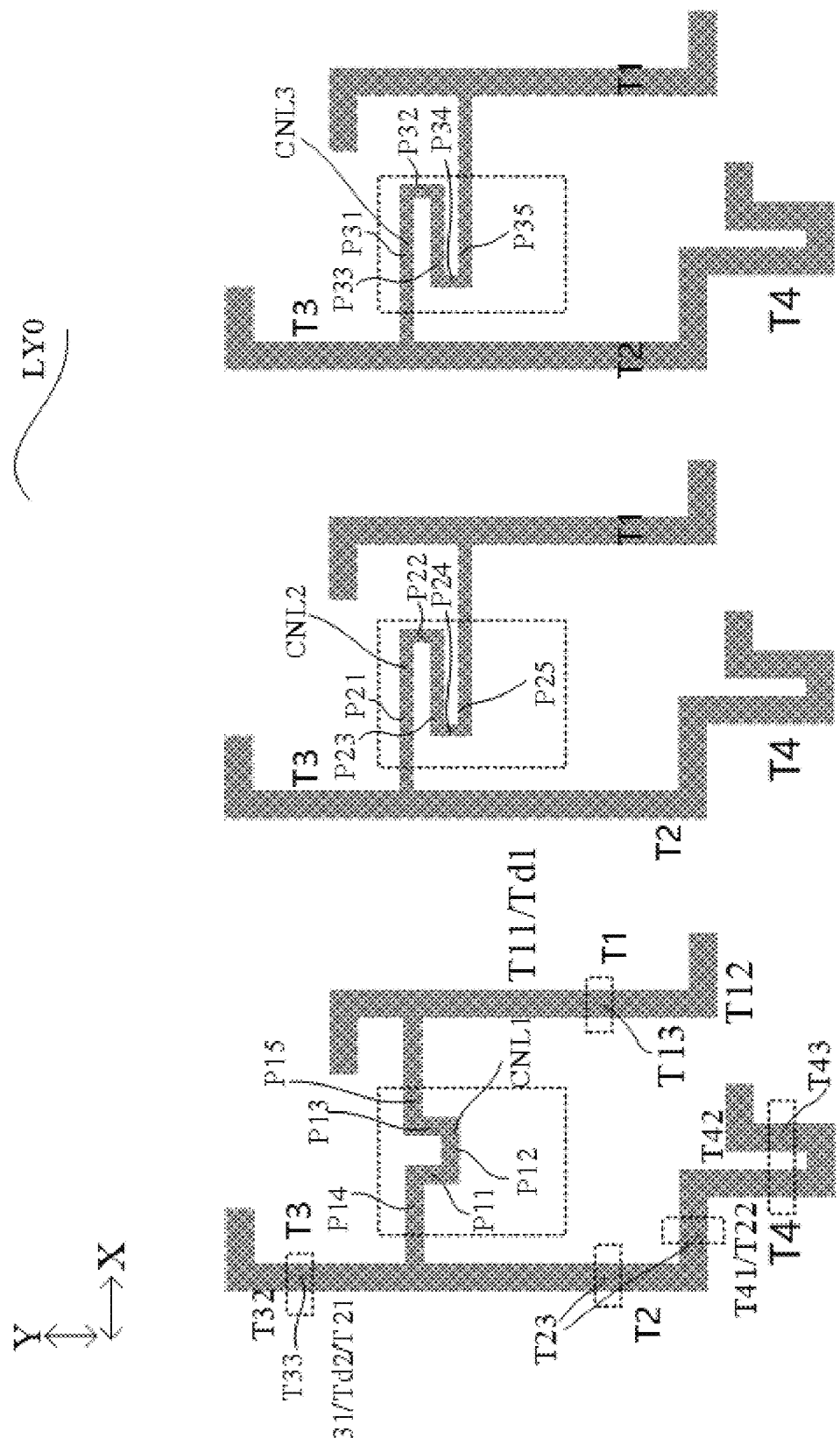
FIG. 3A is a plan view of an active layer in the display panel provided by an embodiment of the present disclosure.
Figure 3B:
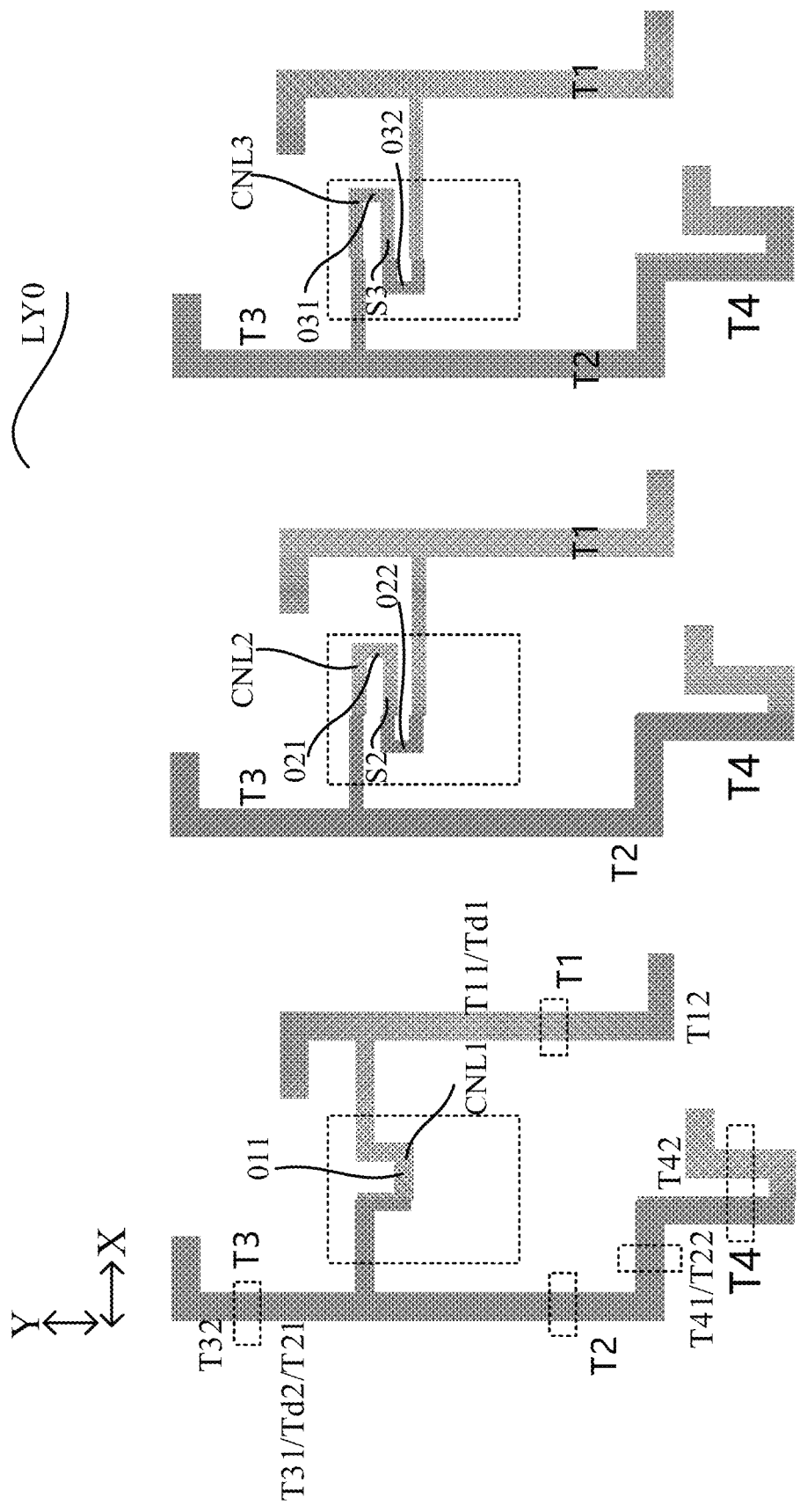
FIG. 3B is a plan view of an active layer in the display panel provided by an embodiment of the present disclosure.
Figure 3C:
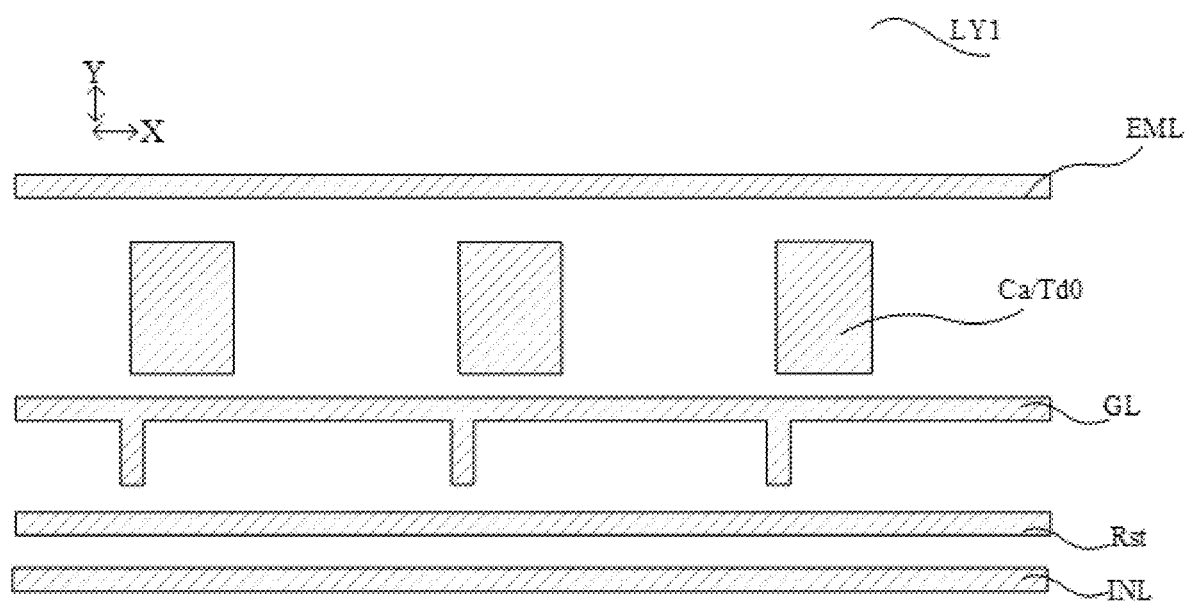
FIG. 3C is a plan view of a first conductive layer in the display panel provided by an embodiment of the present disclosure.
Figure 3D:
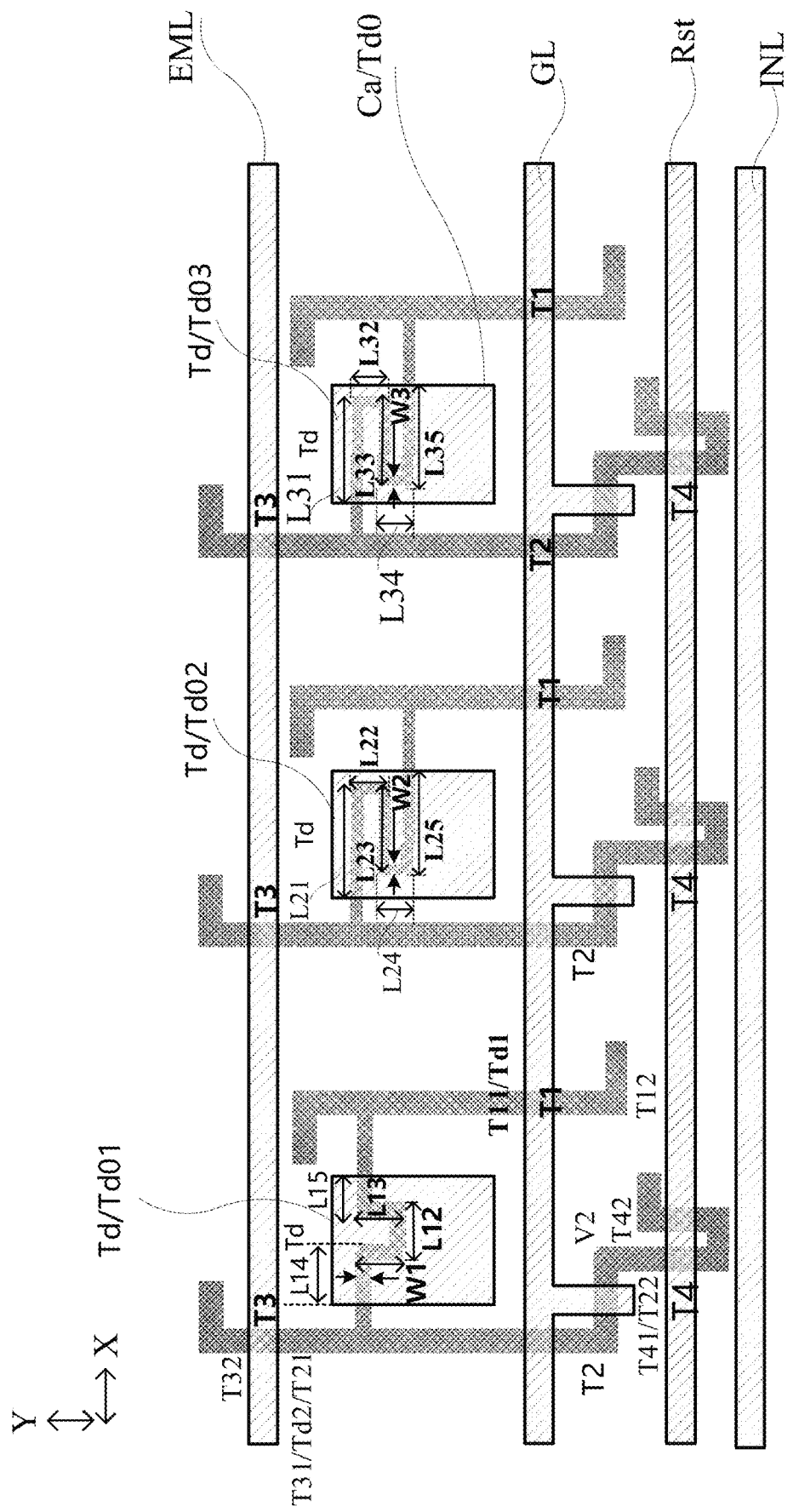
FIG. 3D is a plan view of the active layer and the first conductive layer in the display panel provided by an embodiment of the present disclosure.
Figure 3E:
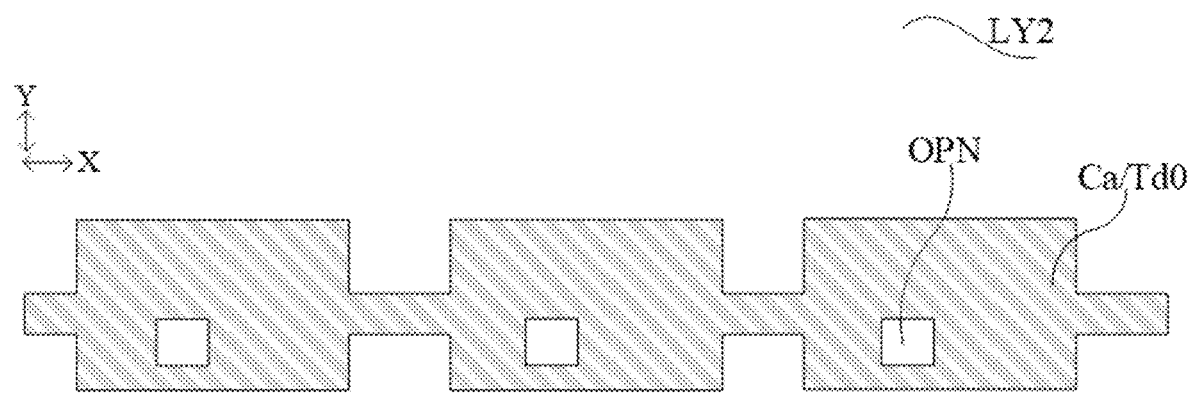
FIG. 3E is a plan view of a second conductive layer in the display panel provided by an embodiment of the present disclosure.
Figure 3F:
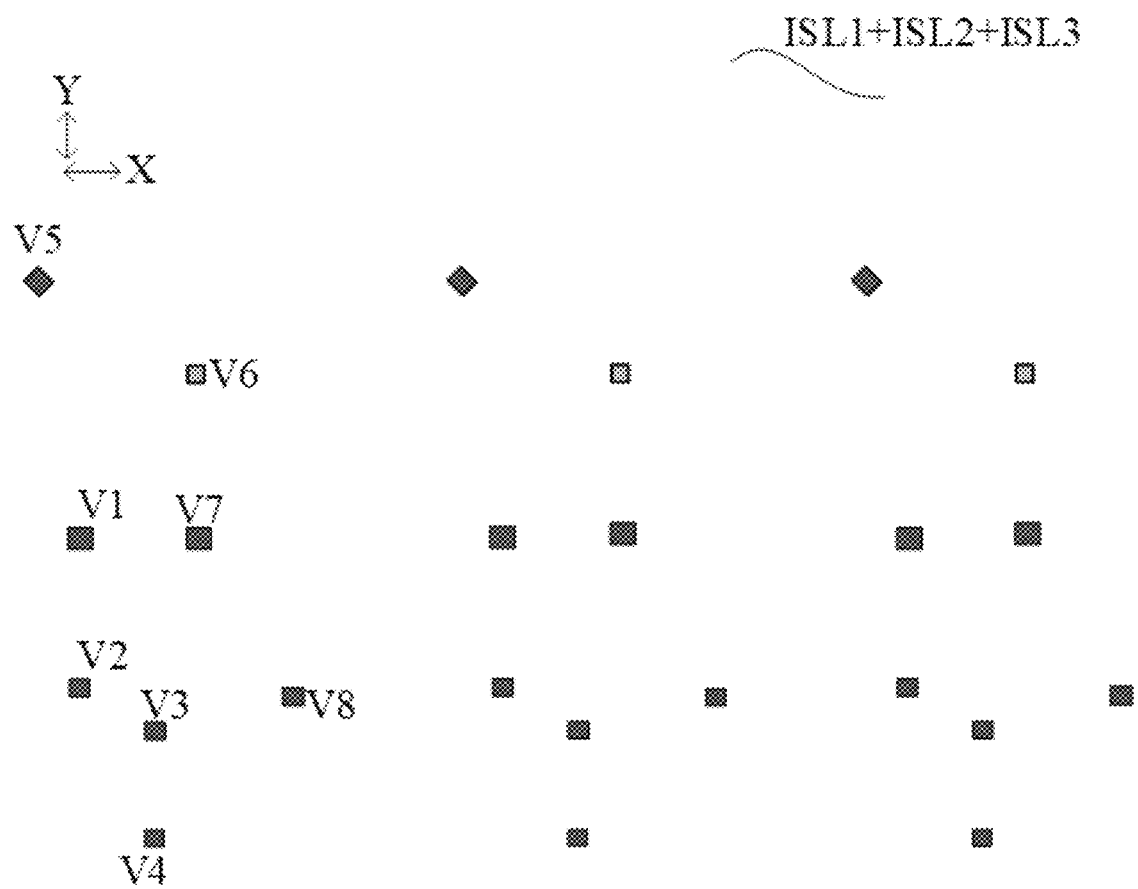
FIG. 3F is a plan view of a via hole penetrating at least one of a first insulating layer, a second insulating layer, and a third insulating layer in the display panel provided by an embodiment of the present disclosure.
Figure 3G:
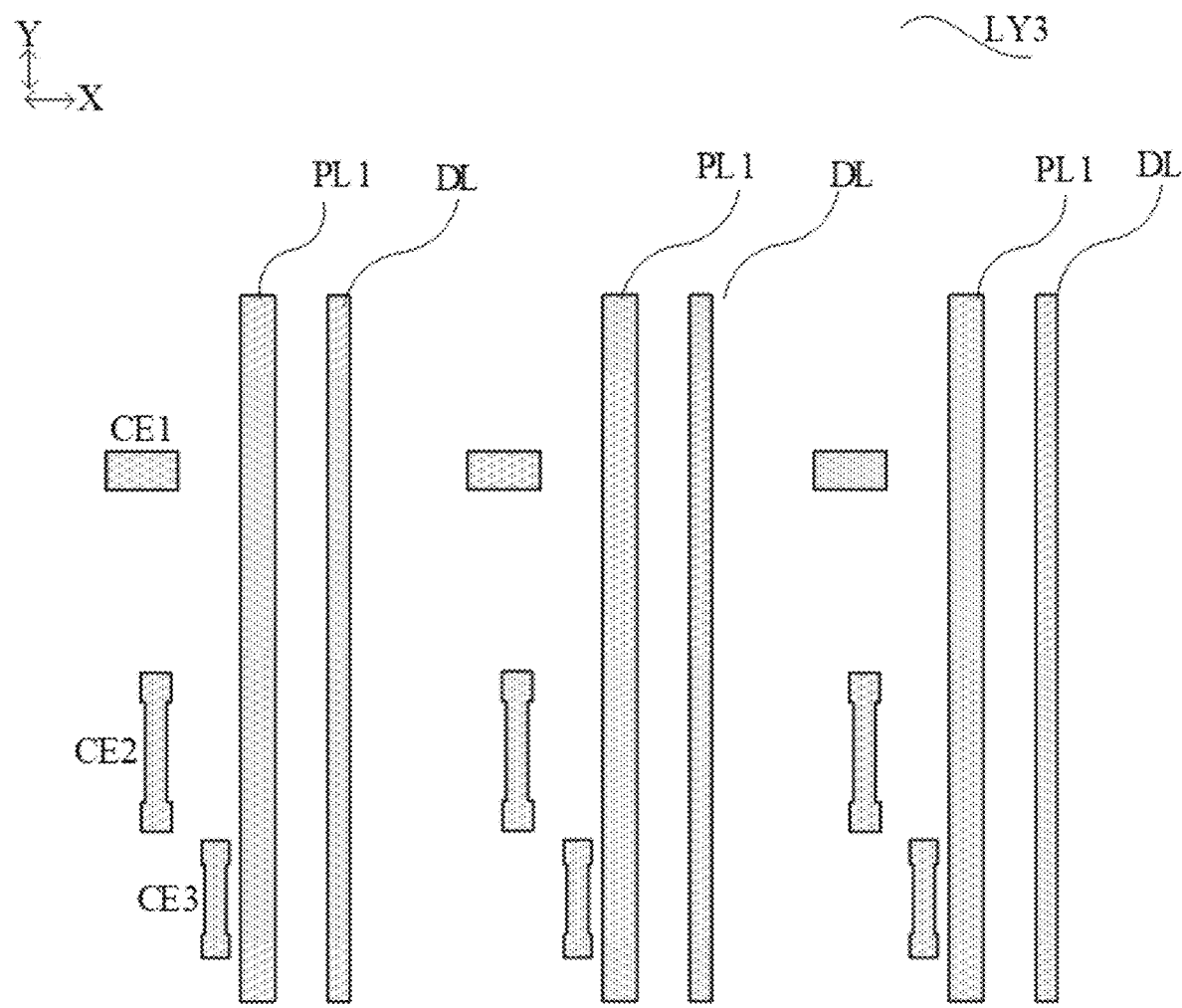
FIG. 3G is a plan view of a third conductive layer in the display panel provided by an embodiment of the present disclosure.
Figure 3H:
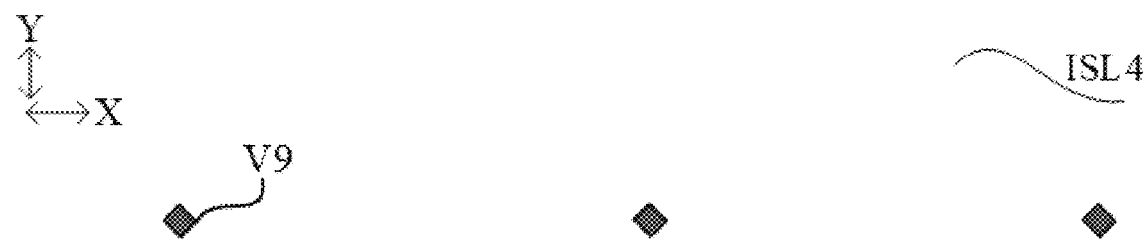
FIG. 3H is a plan view of a via hole penetrating a fourth insulating layer in the display panel provided by an embodiment of the present disclosure.
Figure 3I:
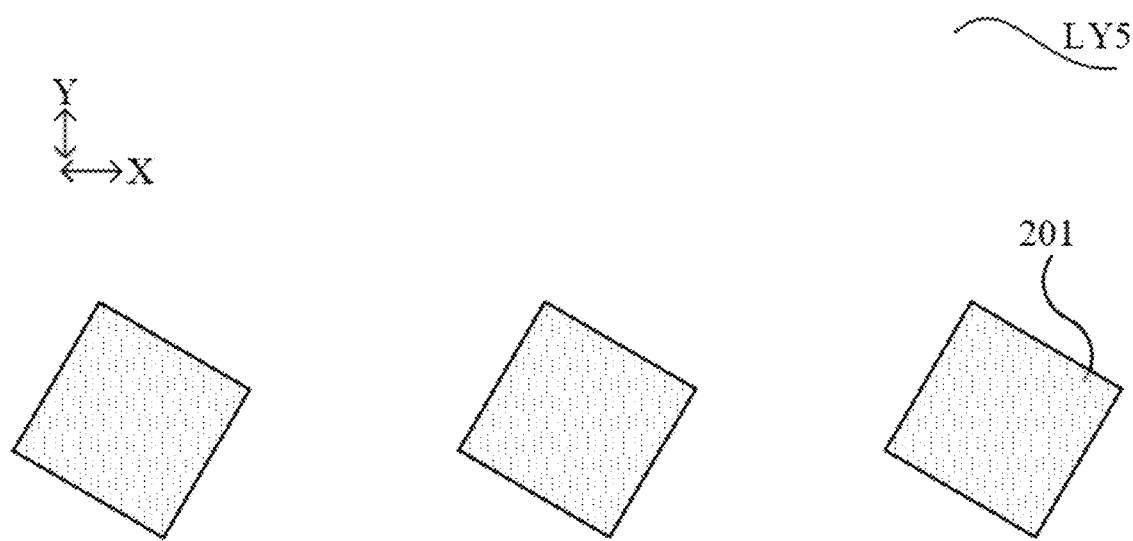
FIG. 3I is a plan view of a first electrode layer in the display panel provided by an embodiment of the present disclosure.
Figure 4:
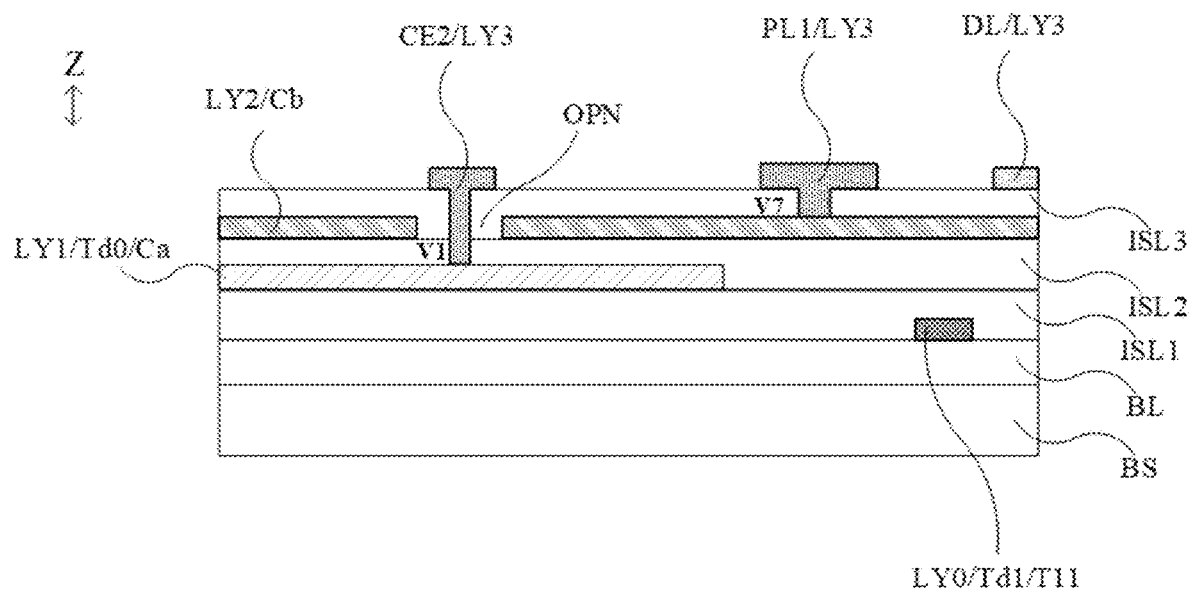
FIG. 4 is a cross-sectional view taken along line A-B of FIG. 2.
Figure 5:
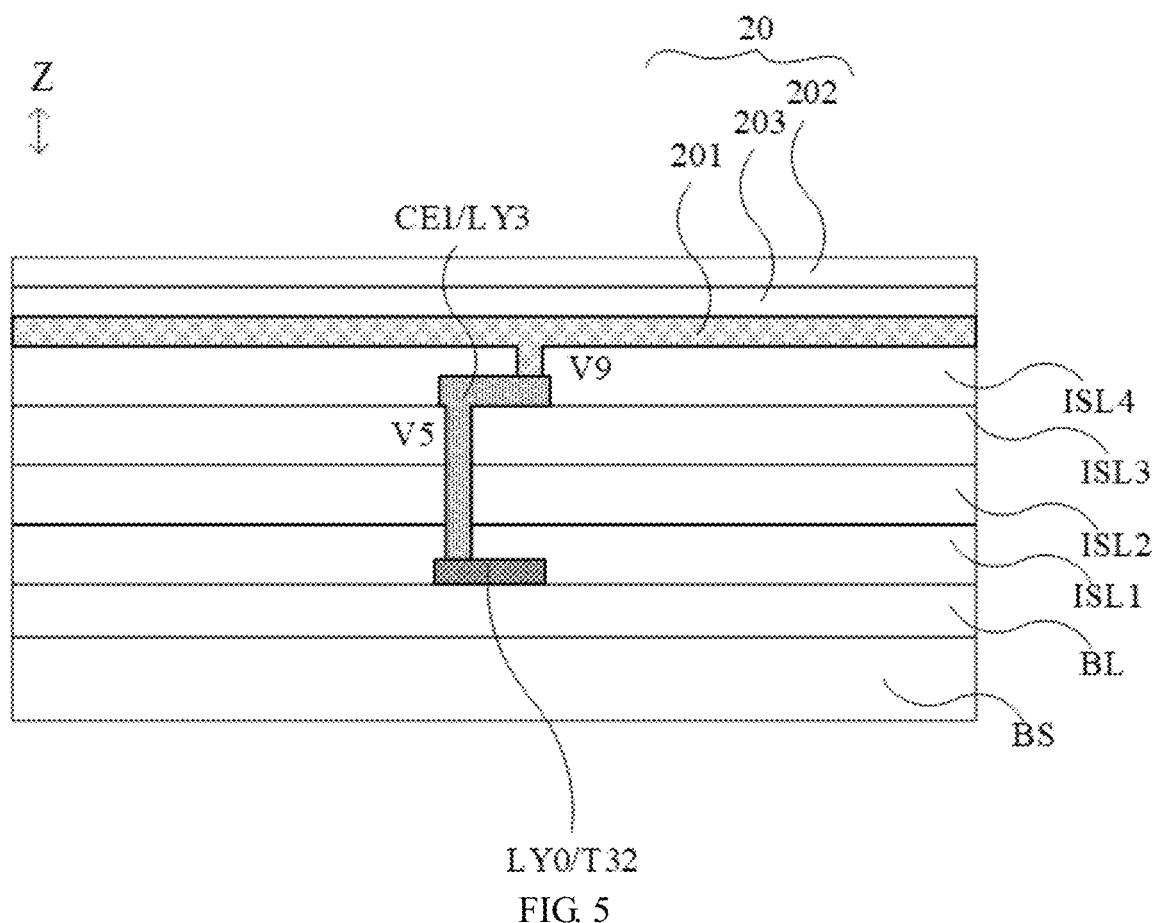
FIG. 5 is a cross-sectional view taken along line E-F of FIG. 2.

FIG. 3A to FIG. 3I are plan views of patterns of a single layer or a stacked layer in the display panel provided by an embodiment of the present disclosure. FIG. 3A is a plan view of an active layer in the display panel provided by an embodiment of the present disclosure. FIG. 3B is a plan view of an active layer in the display panel provided by an embodiment of the present disclosure. FIG. 3C is a plan view of a first conductive layer in the display panel provided by an embodiment of the present disclosure. FIG. 3D is a plan view of the active layer and the first conductive layer in the display panel provided by an embodiment of the present disclosure. FIG. 3E is a plan view of a second conductive layer in the display panel provided by an embodiment of the present disclosure. FIG. 3F is a plan view of a via hole penetrating at least one of a first insulating layer, a second insulating layer, and a third insulating layer in the display panel provided by the embodiment of the present disclosure. FIG. 3G is a plan view of a third conductive layer in the display panel provided by an embodiment of the present disclosure. FIG. 3H is a plan view of a via hole penetrating a fourth insulating layer in the display panel provided by an embodiment of the present disclosure. FIG. 3I is a plan view of a first electrode layer in the display panel provided by an embodiment of the present disclosure. FIG. 4 is a cross-sectional view taken along line A-B of FIG. 2. FIG. 5 is a cross-sectional view taken along line E-F of FIG. 2. Film layers above a first electrode layer LY5 (illustrated in FIG. 3I) are omitted in FIG. 2. The display panel provided by the embodiments of the present disclosure will be described in detail below with reference to FIG. 2 to FIG. 5.

FIG. 2 to FIG. 3I illustrate a first direction X and a second direction Y, the first direction X intersects with the second direction Y. For example, the first direction X is perpendicular to the second direction Y. FIG. 4 to FIG. 5 illustrate a third direction Z, which is perpendicular to the first direction X and perpendicular to the second direction Y. For example, the first direction X and the second direction Y are both parallel with a main surface of the base substrate BS (as illustrated in FIG. 2, FIG. 4 to FIG. 5), and the main surface of the base substrate BS is a surface on which film layers are formed. The third direction Z may be a direction perpendicular to the main surface. For example, the third direction Z is a thickness direction of the base substrate BS.

FIG. 3A illustrates an active layer LY0. As illustrated in FIG. 3A, the active layer LY0 includes a channel T13 of the first transistor T1, a channel T23 of the second transistor T2, a channel T33 of the third transistor T3, and a channel T43 of the fourth transistor T4.

For example, as illustrated in FIG. 3A, the driving transistor Td of the pixel circuit 10 of the first pixel unit 1011 includes a first channel CNL1, and the driving transistor Td of the pixel circuit 10 of the second pixel unit 1012 includes a second channel CNL2.

For example, as illustrated in FIG. 3A, the driving transistor Td of the pixel circuit 10 of the third pixel unit 1013 includes a third channel CNL3.

For example, the active layer of each transistor may include a source electrode region, a drain electrode region, and a channel between the source electrode region and drain electrode region. For example, the channel has characteristics of a semiconductor; the source electrode region and the drain electrode region are on two sides of the channel, and can be doped with impurities, and therefore are conductive and can be used as the first electrode and second electrode of the transistor, respectively. One of the first electrode and the second electrode of the transistor is the source electrode, and the other one of the first electrode and the second electrode of the transistor is the drain electrode.

For example, the material of the semiconductor layer LY0 may include oxide semiconductor, organic semiconductor or amorphous silicon, polysilicon and so on. For example, the oxide semiconductor includes metal oxide semiconductor (for example, indium gallium zinc oxide (IGZO)), the polysilicon includes low temperature polysilicon or high temperature polysilicon, which is not limited in the embodiment of the present disclosure. It should be noted that, the above-mentioned source region and drain region may be regions doped with n-type impurities or p-type impurities, which are not limited in the embodiments of the present disclosure.

For example, as illustrated in FIG. 2 and FIG. 3A, the width-to-length ratio of the first channel CNL1 is greater than the width-to-length ratio of the second channel CNL2, and the shape of the first channel CNL1 is different from the shape of the second channel CNL2.

In the display panel provided by the present disclosure, the channels of the driving transistors of the pixel units that emit light of different colors adopt different shapes and different width-to-length ratios, which can compensate a difference between light-emitting efficiency and lifespan of the pixel units that emit light of different colors, and effectively improving a display uniformity and the lifespan of the display device.

In the display panel provided by the present disclosure, the driving transistors of the pixel circuits are provided with channels of different shapes, and the driving transistors adopt different width-to-length ratios, so as to compensate for a problem of light-emitting efficiency difference of the pixel units that emit light of different colors, and improve the display uniformity and the lifespan of the display device.

For example, in some embodiments, a width of the first channel CNL1 is the same as a width of the second channel CNL2, and a length of the first channel CNL1 is less than a length of the second channel CNL2.

For example, as illustrated in FIG. 2 and FIG. 3A, the shape of the first channel CNL1 includes a U-shape. For example, as illustrated in FIG. 3B, an opening of the U-shaped first channel CNL1 faces upward.

For example, as illustrated in FIG. 3A, the first channel CNL1 includes a first portion P11, a second portion P12, and a third portion P13. The first portion P11, the second portion P12, and the third portion P13 are sequentially connected so as to form a U-shaped structure. As illustrated in FIG. 3A, the first channel CNL1 further includes a fourth portion P14 and a fifth portion P15, the fourth portion P14 is connected with the first portion P11, and the fifth portion P15 is connected with the third portion P13. As illustrated in FIG. 3A, the first portion P11 and the third portion P13 extend in the second direction Y, and the second portion P12 extends in the first direction X. As illustrated in FIG. 3A, the fourth portion P14 and the fifth portion P15 both extend in the first direction X.

For example, the shape of the second channel CNL2 includes a mirrored S shape, a serpentine shape, a square waveform, a zigzag shape, or a double U shape.

For example, as illustrated in FIG. 3B, the shape of the second channel CNL2 includes a double U-shape, and the double U-shape includes a first U-shaped portion 021 and a second U-shaped portion 022, and the first U-shaped portion 021 and the second U-shaped portion 022 share the same side S2, and opening directions of the first U-shaped portion 021 and the second U-shaped portion 022 are different. As illustrated in FIG. 3A, the opening direction of the first U-shaped portion 021 is leftward, and the opening direction of the second U-shaped portion 022 is rightward. For example, as illustrated in FIG. 3B, the opening directions of the first U-shaped portion 021 and the second U-shaped portion 022 of the second channel CNL2 are different from the opening direction of the U-shaped first channel CNL1.

For example, as illustrated in FIG. 3A, the second channel CNL2 includes a first portion P21, a second portion P22, a third portion P23, a fourth portion P24, and a fifth portion P25 connected in sequence; the first portion P21, the third portion P23, and the fifth portion P25 all extend in the first direction X; the second portion P22 and the fourth portion P24 both extend in the second direction Y.

For example, in some embodiments, the width-to-length ratio of the first channel CNL1 is different from the width-to-length ratio of the third channel CNL3.

For example, in some embodiments, the width-to-length ratio of the first channel CNL1, the width-to-length ratio of the second channel CNL2, and the width-to-length ratio of the third channel CNL3 are all different.

For example, in some embodiments, the width-to-length ratio of the second channel CNL2 is greater than or equal to the width-to-length ratio of the third channel CNL3.

For example, as illustrated in FIG. 3A, the shape of the third channel CNL3 is the same as the shape of the second channel CNL2. For example, the shape of the third channel CNL3 also includes a mirror image of S-shape, a serpentine shape, a square waveform, a zigzag shape, or a double U-shape.

For example, as illustrated in FIG. 3B, the shape of the third channel CNL3 includes the double U-shape, and the double U-shape includes a first U-shaped portion 031 and a second U-shaped portion 032, and the first U-shaped portion 031 and the second U-shaped portion 031 share the same side S3, and the opening directions of the first U-shaped portion 031 and the second U-shaped portion 032 are different. As illustrated in FIG. 3A, the opening direction of the first U-shaped portion 031 is leftward, and the opening direction of the second U-shaped portion 032 is rightward. For example, as illustrated in FIG. 3B, the opening direction of the first U-shaped portion 031 and the second U-shaped portion 032 of the third channel CNL3 are different from the opening direction of the U-shaped first channel CNL1. For example, as illustrated in FIG. 3B, the opening direction of the first U-shaped portion 021 of the second channel CNL2 is the same as the opening direction of the first U-shaped portion 031 of the third channel CNL3, and the opening direction of the second U-shaped portion 022 of the second channel CNL2 is the same as the opening direction of the second U-shaped portion 032 of the third channel CNL3.

For example, as illustrated in FIG. 3A, the third channel CNL3 includes a first portion P31, a second portion P32, a third portion P33, a fourth portion P34, and a fifth portion P35 that are connected in sequence; the first portion P31, the third portion P33, and the fifth portion P35 all extend in the first direction X; the second portion P32 and the fourth portion P34 both extend in the second direction Y.

For example, in some embodiments, a width of the third channel CNL3 is the same as a width of the second channel CNL2, and a length of the third channel CNL3 is greater than or equal to a length of the second channel CNL2. Thus, the width-to-length ratio of the second channel CNL2 is greater than or equal to the width-to-length ratio of the third channel CNL3.

As illustrated in FIG. 3D, the width of the first channel CNL1 is w1, the width of the second channel CNL2 is w2, and the width of the third channel CNL3 is w3. In some embodiments, w1=w2=w3, but not limited thereto. In other embodiments, w1, w2, w3 are different. In some embodiments, w1 is greater than w2 and greater than w3. In other embodiments, w1 is greater than w2, and w2=w3.

As illustrated in FIG. 3A and FIG. 3D, a length of the first portion P11 of the first channel CNL1 is L11, a length of the second portion P12 of the first channel CNL1 is L12, and a length of the third portion P13 of the first channel CNL1 is L13, then, the length of the first channel CNL1 L1=L11+L12+L13+L14+L15. Therefore, the width-to-length ratio of the first channel CNL1 is w1/L1.

As illustrated in FIG. 3A and FIG. 3D, a length of the first portion P21 of the second channel CNL2 is L21, a length of the second portion P22 of the second channel CNL2 is L22, and a length of the third portion P23 of the second channel CNL2 is L23, a length of the fourth portion P24 of the second channel CNL2 is L24, and a length of the fifth portion P25 of the second channel CNL2 is L25, then, the length of the second channel CNL2 L2=L21+L22+L23+L24+L25. Therefore, the width-to-length ratio of the second channel CNL2 is w2/L2.

As illustrated in FIG. 3A and FIG. 3D, a length of the first portion P31 of the third channel CNL3 is L31, a length of the second portion P32 of the third channel CNL3 is L32, a length of the third portion P33 of the third channel CNL3 is L33, a length of the fourth portion P34 of the third channel CNL3 is L34, and a length of the fifth portion P35 of the third channel CNL3 is L35, then, the length of the third channel CNL3 L3=L31+L32+L33+L34+L35. Therefore, the width-to-length ratio of the third channel CNL3 is w2/L3.

For example, in some embodiments, L2=L3, for further example, L21=L31, L22=L32, L23=L33, L24=L34, L25=L35.

For example, as illustrated in FIG. 3A and FIG. 3D, the length L21 of the first portion P21 of the second channel CNL2, the length L23 of the third portion P23 of the second channel CNL2, and the length L25 of the fifth portion P25 of the second channel CNL2 are all greater than the length L11 of the first portion P11 of the first channel CNL1, and are all greater than the length L13 of the third portion P13 of the first channel CNL1. For example, the length L21, the length L23, and the length L25 are all greater than or equal to twice the length L11, and are all greater than or equal to twice the length L13.

For example, as illustrated in FIG. 3A and FIG. 3D, the length L31 of the first portion P31 of the third channel CNL3, the length L33 of the third portion P33 of the third channel CNL3, the length L35 of the fifth portion P35 of the third channel CNL3 are all greater than the length L13 of the third portion P13 of the first channel CNL1. For example, the length L31, the length L33, and the length L35 are all greater than or equal to twice the length L11, and are all greater than or equal to twice the length L13.

For example, in some embodiments, w1=w2=w3, L1<L2, L1<L3, and L2=L3.

For example, in some embodiments, w1=w2=w3, L1<L2, L1<L3, and L2<L3.

For example, in some embodiments, w1>w2=w3, and L1<L2=L3.

For example, in some embodiments, w1>w2=w3, and L1<L2<L3.

For example, as illustrated in FIG. 2, FIG. 4 and FIG. 5, the display panel further includes a base substrate BS, and the pixel unit 101 is located on the base substrate BS. As illustrated in FIG. 3D, the driving transistor Td of the pixel circuit 10 of the first pixel unit 1011 includes a first gate electrode Td01, and the driving transistor Td of the pixel circuit 10 of the second pixel unit 1012 includes a second gate electrode Td02. An orthographic projection of the first gate electrode Td01 on the base substrate partially overlaps with an orthographic projection of the first channel CNL1 on the base substrate, and an orthographic projection of the second gate electrode Td02 on the base substrate partially overlaps with an orthographic projection of the second channel CNL2 on the base substrate.

For example, as illustrated in FIG. 3D, the driving transistor Td of the pixel circuit 10 of the third pixel unit 1013 includes a third gate electrode Td03, an orthographic projection of the third gate electrode Td03 on the base substrate partially overlaps with an orthographic projection of the third channel CNL3 on the base substrate.

For example, in some embodiments, a size of the first gate electrode Td01 in the first direction X, a size of the second gate electrode Td02 in the first direction X, and a size of the third gate electrode Td03 in the first direction X are same. For example, in some embodiments, a size of the first gate electrode Td01 in the second direction Y, a size of the second gate electrode Td02 in the second direction Y, and a size of the third gate electrode Td03 in the second direction Y are same.

FIG. 3C illustrates a first conductive layer LY1. The first conductive layer LY1 includes the light-emitting control signal line EML, the gate line GL, the reset control signal line Rst, the initialization signal line INL, and the first electrode plate Ca of the storage capacitor Cst (the gate electrode Td0 of the driving transistor Td). For example, as illustrated in FIG. 3C, the light-emitting control signal line EML, the gate line GL, the reset control signal line Rst, and the initialization signal line INL all extend in the first direction X and are arranged in the second direction Y. As illustrated in FIG. 3D, both the second transistor T2 and the fourth transistor T4 are dual-gate transistors.

For example, the light-emitting element 20 includes an organic light-emitting diode or a quantum dot light-emitting diode, and the display panel includes an organic light-emitting diode display panel or a quantum dot light-emitting diode display panel. In the pixel unit of the display panel, the driving transistor is connected with the light-emitting element, and outputs the driving current to the light-emitting element under the control of signals such as the data signal and the scan signal, thereby driving an organic light-emitting element to emit light.

It should be noted that, in the display panel provided by the embodiments of the present disclosure, the third pixel unit 1013 may not be provided in the pixel PX.

FIG. 3E illustrates a second conductive layer LY2. The second conductive layer LY2 includes the second electrode plate Cb of the storage capacitor Cst. As illustrated in FIG. 2, FIG. 3E and FIG. 4, the second electrode plate Cb of the storage capacitor Cst includes an opening OPN.

FIG. 3G illustrates a third conductive layer LY3. The third conductive layer LY3 includes the data line DL, the first power supply line PL1, a connection electrode CE1, a connection electrode CE2, and a connection electrode CE3. The connection electrode CE1 may be referred to as a first connection electrode, the connection electrode CE2 may be referred to as a second connection electrode, and the connection electrode CE3 may be referred to as a third connection electrode.

As illustrated in FIG. 4 and FIG. 5, the display panel includes a buffer layer BL, an active layer LY0, a first insulating layer ISL1, the first conductive layer LY1, a second insulating layer ISL2, the second conductive layer LY2, a third insulating layer ISL3, and a third conductive layer LY3. A fourth insulating layer ISL4 is located on the third conductive layer LY3, and the first electrode 201 of the light-emitting element 20 is connected with the connection electrode CE1 through a via hole V9 penetrating the fourth insulating layer ISL4. The connection electrode CE1 is connected with the second electrode T32 of the third transistor T3 through a via hole V5, which penetrates the first insulating layer ISL1, the second insulating layer ISL2, and the third insulating layer ISL3. As illustrated in FIG. 3H, the via hole V9 penetrates the fourth insulating layer ISL4.

FIG. 3F illustrates via holes penetrating at least one of the first insulating layer ISL1, the second insulating layer ISL2, and the third insulating layer ISL3. FIG. 3F illustrates via hole V1, via hole V2, via hole V3, via hole V4, via hole V5, via hole V6, via hole V7, and via hole V8.

Referring to FIG. 2, FIG. 3F and FIG. 3G, one end of the connection electrode CE2 is connected with the first electrode plate Ca of the storage capacitor Cst (the gate electrode Td0 of the driving transistor Td) through the via hole V1, and the other end of the connection electrode CE2 is connected with the first electrode T41 of the fourth transistor T4 through the via hole V2.

As illustrated in FIG. 2 and FIG. 4, the first power supply line PL1 is connected with the second electrode plate Cb of the storage capacitor Cst through the via hole V7 penetrating the third insulating layer ISL3, and the first electrode plate Ca of the storage capacitor Cst and the gate electrode Td0 of the driving transistor Td are integrally formed, and are connected with one end of the connection electrode CE2 (as illustrated in FIG. 2 and FIG. 3G) through the via hole V1, and the other end of the connection electrode CE2 (as illustrated in FIG. 2 and FIG. 3G) is connected with the second electrode T22 of the second transistor T2 through the via hole V2. For example, the via hole V1 penetrates the second insulating layer ISL2 and the third insulating layer ISL3, and the via hole V2 penetrates the first insulating layer ISL1, the second insulating layer ISL2, and the third insulating layer ISL3.

As illustrated in FIG. 2, the connection electrode CE2 passes through the opening OPN and is connected with the gate electrode Td0 of the driving transistor Td.

As illustrated in FIG. 2, one end of the connection electrode CE3 is connected with the second electrode T42 of the fourth transistor T4 through the via hole V3, and the other end of the connection electrode CE3 is connected with the initialization signal line INL through the via hole V4. For example, the via hole V3 penetrates the first insulating layer ISL1, the second insulating layer ISL2, and the third insulating layer ISL3. For example, the via hole V4 penetrates the second insulating layer ISL2 and the third insulating layer ISL3.

As illustrated in FIG. 2, the data line DL is connected with the second electrode T12 of the first transistor T1 through the via hole V8. For example, the via hole V8 penetrates the first insulating layer ISL1, the second insulating layer ISL2, and the third insulating layer ISL3.

As illustrated in FIG. 2, the first power supply line PL is connected with the second electrode plate Cb of the storage capacitor Cst through the via hole V7. The via hole V7 penetrates the third insulating layer ISL3.

As illustrated in FIG. 2, the first power supply line PL is connected with the first electrode Td1 of the driving transistor Td through the via hole V6. The via hole V6 penetrates the first insulating layer ISL1, the second insulating layer ISL2, and the third insulating layer ISL3.

As illustrated in FIG. 5, the light-emitting element 20 further includes the second electrode 202 and a light-emitting layer 203 located between the first electrode 201 and the second electrode 202. In pixel units that emit light of different colors, materials of the light-emitting layer 203 are different.

FIG. 3B illustrates a via hole V11, a via hole V12, a via hole V13, and a via hole V14 penetrating the first insulating layer ISL1. FIG. 3F illustrates the via hole V5, the via hole V7, a via hole V23, a via hole V24, and a via hole V25 penetrating at least one of the first insulating layer ISL1, the second insulating layer ISL2, and the third insulating layer ISL3. FIG. 3H illustrates the via hole V9 penetrating the fourth insulating layer ISL4.

As illustrated in FIG. 2, a part of the light-emitting control signal line EML serves as the gate electrode of the third transistor T3, a part of the gate line GL serves as the gate electrode of the first transistor T1, a part of the gate line GL serves as the gate electrode of the second transistor T2, and a part of the reset control signal line Rst serves as the gate electrode of the fourth transistor T4.

For example, the base substrate BS, the buffer layer BF, the first insulating layer ISL1, the second insulating layer ISL2, the third insulating layer ISL3, and the fourth insulating layer ISL4 are all made of insulating materials. For example, the base substrate BS includes a flexible material such as polyimide, but is not limited thereto. At least one of the buffer layer BF, the first insulating layer ISL1, the second insulating layer ISL2, the third insulating layer ISL3, and the fourth insulating layer ISL4 is made of an inorganic insulating material or an organic insulating material. For example, the inorganic insulating material includes silicon oxide, silicon nitride, silicon oxynitride, etc., and the organic insulating material includes resin, but is not limited thereto.

For example, the first conductive layer LY1, the second conductive layer LY2, and the third conductive layer LY3 are all made of metal materials. The first conductive layer LY1, the second conductive layer LY2, and the third conductive layer LY3 can be made of the same material, or can be made of different materials, which can be determined as required.

In the embodiments of the present disclosure, patterns of each single layer and via holes may be formed by a patterning process. For example, forming a specific pattern includes forming a thin film, forming a photoresist pattern on the thin film, and patterning the thin film by using the photoresist pattern as a mask to form the specific pattern. The first conductive layer LY1, the second conductive layer LY2, the third conductive layer LY3, and the via holes in the insulating layer can all be formed by this method. For the active layer LY0, a semiconductor pattern can be formed first, the first insulating layer ISL1 is formed on the semiconductor pattern, the first conductive layer LY1 is formed on the first insulating layer ISL1, and the first conductive layer LY1 is used as a mask for doping the semiconductor pattern to form the active layer LY0 including the channel, the source region and the drain region on both sides of the channel.

It should be noted that the layout of the pixel units of the display panel provided by the embodiments of the present disclosure is not limited to that illustrated in FIG. 2, and other layout diagrams may be formed by transforming on the basis of FIG. 2. The above description is given with reference to the case where the pixel unit has 5T1C by way of example, but the embodiments of the present disclosure are not limited thereto. For example, each pixel unit 101 may include pixel circuits and light-emitting elements with circuit structures such as a 7T1C, an 8T2C, or a 4T1C in the art, the pixel circuit works under the control of the data signal transmitted through the data line, the gate electrode scan signal transmitted through the gate line, and the light-emitting control signal provided by the light-emitting control signal line to drive the light-emitting element to emit light, so as to realize operations such as display.

At least one embodiment of the present disclosure provides a display device including any one of the above-mentioned display panels.

For example, the display device may be an organic light-emitting diode display device. The display device may be any organic light-emitting diode display device such as any product or component with a display function, for example a TV, a digital camera, a mobile phone, a watch, a tablet computer, a notebook computer, a navigator and so on.

It should be noted that, for the sake of clarity, in the drawings used to describe the embodiments of the present disclosure, the thickness of a layer or region is exaggerated. It can be understood that when an element such as a layer, film, region, or substrate is referred to as being "on" or "under" another element, the element can be "directly" "on" or "under" the other element, or there may be intermediate elements.

In the embodiments of the present disclosure, the patterning or patterning process may only include a photolithography process, or include a photolithography process and an etching process, or may include other processes for forming predetermined patterns such as printing process and inkjet process. The photolithography process refers to the process including film formation, exposure, development, etc., using photoresist, mask, exposure machine, etc. to form patterns. The corresponding patterning process can be selected according to the structure formed in the embodiment of the present disclosure.

The above are only specific implementations of the present disclosure, the protection scope of the present disclosure is not limited thereto. Any changes or substitutions easily occur to those skilled in the art within the technical scope of the present disclosure should be covered in the protection scope of the present disclosure. Therefore, the protection scope of the present disclosure should be based on the protection scope of the claims.

What is claimed is:

1. A display panel, comprising: a plurality of pixel units,
wherein each of the plurality of pixel units comprises a pixel circuit and a light-emitting element, the pixel circuit is configured to drive the light-emitting element,
the pixel circuit comprises a driving transistor,
the plurality of pixel units comprise a first pixel unit and a second pixel unit, the first pixel unit is configured to emit light of a first color, the second pixel unit is configured to emit light of a second color, the driving transistor of the pixel circuit of the first pixel unit comprises a first channel, and the driving transistor of the pixel circuit of the second pixel unit comprises a second channel, a width-to-length ratio of the first channel is greater than a width-to-length ratio of the second channel, and a shape of the first channel is different from a shape of the second channel, wherein the shape of the first channel comprises a U-shape.

2. The display panel according to claim 1, wherein a width of the first channel is the same as a width of the second channel, and a length of the first channel is less than a length of the second channel.

3. The display panel according to claim 1, wherein the shape of the second channel comprises a mirror image of S-shape, a serpentine shape, a square waveform, a zigzag shape, or a double U-shape.

4. The display panel according to claim 1, wherein the second channel comprises a first portion, a second portion, a third portion, a fourth portion, and a fifth portion that are connected in sequence, the first portion, the third portion, and the fifth portion all extend in a first direction, both the second portion and the fourth portion extend in a second direction, the first direction intersects with the second direction.

5. The display panel according to claim 1, wherein the plurality of pixel units further comprises a third pixel unit, the third pixel unit is configured to emit light of a third color, the driving transistor of the pixel circuit of the third pixel unit comprises a third channel, and the width-to-length ratio of the first channel is different from a width-to-length ratio of the third channel.

6. The display panel according to claim 5, wherein the width-to-length ratio of the first channel, the width-to-length ratio of the second channel, and the width-to-length ratio of the third channel are different from one another.

7. The display panel according to claim 5, wherein the width-to-length ratio of the second channel is greater than or equal to the width-to-length ratio of the third channel.

8. The display panel according to claim 5, wherein the shape of the third channel comprises a mirror image of S-shape, a serpentine shape, a square waveform, a zigzag shape, or a double U-shape.

9. The display panel according to claim 5, wherein a width of the third channel is the same as a width of the second channel, and a length of the third channel is greater than or equal to a length of the second channel.

10. The display panel according to claim 5, further comprising a base substrate, wherein the pixel unit is located on the base substrate, and the driving transistor of the pixel circuit of the third pixel unit comprises a third electrode, an orthographic projection of the third gate electrode on the base substrate partially overlaps with an orthographic projection of the third channel on the base substrate.

11. The display panel according to claim 5, wherein the first pixel unit comprises a pixel unit emitting blue light, the second pixel unit comprises a pixel unit emitting red light, and the third pixel unit comprises a pixel unit emitting green light.

12. The display panel according to claim 1, wherein the pixel circuit further comprises a storage capacitor, a first transistor, a second transistor, a third transistor, and a fourth transistor, a first electrode plate of the storage capacitor is connected with a gate electrode of the driving transistor, a second electrode plate of the storage capacitor is connected with a first power supply line, and a first electrode of the driving transistor is connected with the first power supply line, a gate electrode of the first transistor is connected with a gate line, a first electrode of the first transistor is connected with the first electrode of the driving transistor, a second electrode of the first transistor is connected with a data line, a gate electrode of the second transistor is connected with the gate line, a first electrode of the second transistor is connected with a second electrode of the driving transistor, and a second electrode of the second transistor is connected with the gate electrode of the driving transistor, a gate electrode of the third transistor is connected with a light-emitting control signal line, a first electrode of the third transistor is connected with the second electrode of the driving transistor, and a second electrode of the third transistor is connected with a first electrode of the light-emitting element, a second electrode of the light-emitting element is connected with a second power supply line, a gate electrode of the fourth transistor is connected with a reset control signal line, a first electrode of the fourth transistor is connected with the gate electrode of the driving transistor, and a second electrode of the fourth transistor is connected with an initialization signal line.

13. The display panel according to claim 12, further comprising a first connection electrode, a second connection electrode, and a third connection electrode, wherein one end of the first connection electrode is connected with the first electrode of the light-emitting element, and the other end of the first connection electrode is connected with the second electrode of the third transistor;

the second electrode plate of the storage capacitor has an opening, one end of the second connection electrode passes through the opening and is connected with the gate electrode of the driving transistor, and the other end of the second connection electrode is connected with the first electrode of the fourth transistor and the second electrode of the second transistor;

one end of the third connection electrode is connected with the second electrode of the fourth transistor, and the other end of the third connection electrode is connected with the initialization signal line.

14. The display panel according to claim 1, further comprising a base substrate, wherein the pixel unit is located on the base substrate, and the driving transistor of the pixel circuit of the first pixel unit comprises a first gate electrode, the driving transistor of the pixel circuit of the second pixel unit comprises a second gate electrode, an orthographic projection of the first gate electrode on the base substrate partially overlaps with an orthographic projection of the first channel on the base substrate, an orthographic projection of the second gate electrode on the base substrate partially overlaps with an orthographic projection of the second channel on the base substrate.

15. The display panel according to claim 1, wherein the light-emitting element comprises an organic light-emitting diode, and the display panel comprises an organic light-emitting diode display panel.

16. A display device, comprising the display panel according to claim 1.

17. The display panel according to claim 1, wherein the shape of the second channel comprises a double U-shape, and the double U-shape comprises a first U-shaped portion and a second U-shaped portion, the first U-shaped portion and the second U-shaped portion share a same side, and opening directions of the first U-shaped portion and the second U-shaped portion are different.

18. A display panel, comprising: a plurality of pixel units,
wherein each of the plurality of pixel units comprises a pixel circuit and a light-emitting element, the pixel circuit is configured to drive the light-emitting element,
the pixel circuit comprises a driving transistor,
the plurality of pixel units comprise a first pixel unit and a second pixel unit, the first pixel unit is configured to emit light of a first color, the second pixel unit is configured to emit light of a second color,
the driving transistor of the pixel circuit of the first pixel unit comprises a first channel, and the driving transistor of the pixel circuit of the second pixel unit comprises a second channel,
a width-to-length ratio of the first channel is greater than a width-to-length ratio of the second channel, and a shape of the first channel is different from a shape of the second channel,
wherein the shape of the second channel comprises a double U-shape, and the double U-shape comprises a first U-shaped portion and a second U-shaped portion, the first U-shaped portion and the second U-shaped portion share a same side, and opening directions of the first U-shaped portion and the second U-shaped portion are different.

19. A display panel, comprising: a plurality of pixel units,
wherein each of the plurality of pixel units comprises a pixel circuit and a light-emitting element, the pixel circuit is configured to drive the light-emitting element,
the pixel circuit comprises a driving transistor,
the plurality of pixel units comprise a first pixel unit and a second pixel unit, the first pixel unit is configured to emit light of a first color, the second pixel unit is configured to emit light of a second color,
the driving transistor of the pixel circuit of the first pixel unit comprises a first channel, and the driving transistor of the pixel circuit of the second pixel unit comprises a second channel,
a width-to-length ratio of the first channel is greater than a width-to-length ratio of the second channel, and a shape of the first channel is different from a shape of the second channel,
wherein the plurality of pixel units further comprises a third pixel unit, the third pixel unit is configured to emit light of a third color, the driving transistor of the pixel circuit of the third pixel unit comprises a third channel, and the width-to-length ratio of the first channel is different from a width-to-length ratio of the third channel,
wherein a shape of the third channel is the same as the shape of the second channel.

20. The display panel according to claim 19, wherein the shape of the second channel comprises a double U-shape, and the double U-shape comprises a first U-shaped portion and a second U-shaped portion, the first U-shaped portion and the second U-shaped portion share a same side, and opening directions of the first U-shaped portion and the second U-shaped portion are different.

* * * * *